United States Patent [19]

Tuan

[11] Patent Number: 4,803,536
[45] Date of Patent: Feb. 7, 1989

[54] ELECTROSTATIC DISCHARGE PROTECTION NETWORK FOR LARGE AREA TRANSDUCER ARRAYS

[75] Inventor: Hsing C. Tuan, Palo Alto, Calif.

[73] Assignee: Xerox Corporation, Stamford, Conn.

[21] Appl. No.: 922,603

[22] Filed: Oct. 24, 1986

[51] Int. Cl.$^4$ .................... H01L 45/00; H01L 27/12; H01L 29/78
[52] U.S. Cl. .................... 357/23.13; 357/2; 357/4; 357/23.1; 357/23.7; 357/45; 357/51
[58] Field of Search .................... 357/4, 51, 23.7, 2, 357/23.1, 23.13, 45

[56] References Cited

U.S. PATENT DOCUMENTS

| | | | |
|---|---|---|---|
| 4,070,653 | 1/1978 | Rao et al. | 357/51 |
| 4,332,075 | 6/1982 | Ota et al. | 357/4 |
| 4,618,873 | 10/1986 | Sasano et al. | 357/2 |
| 4,624,737 | 11/1986 | Shimbo | 357/4 |

FOREIGN PATENT DOCUMENTS

| | | | |
|---|---|---|---|
| 59-224172 | 12/1984 | Japan | 357/23.13 |
| 60-38858 | 2/1985 | Japan | 357/23.13 |
| 61-88557 | 5/1986 | Japan | 357/4 |

Primary Examiner—J. Carroll
Assistant Examiner—Ngan V. Ngo
Attorney, Agent, or Firm—Serge Abend

[57] ABSTRACT

An electrostatic discharge protection network for large area transducer arrays in which each transducer has associated therewith an addressing circuit for changing the state of the transducer element. Each addressing circuit includes at least one thin film transistor having a resistive path provided between the thin film transistor gate electrode and one or both of the transistor's other two terminal electrodes in order to provide current leakage paths for equalizing the potential between the gate electrode and the other two terminals during electrostatic discharge.

3 Claims, 4 Drawing Sheets

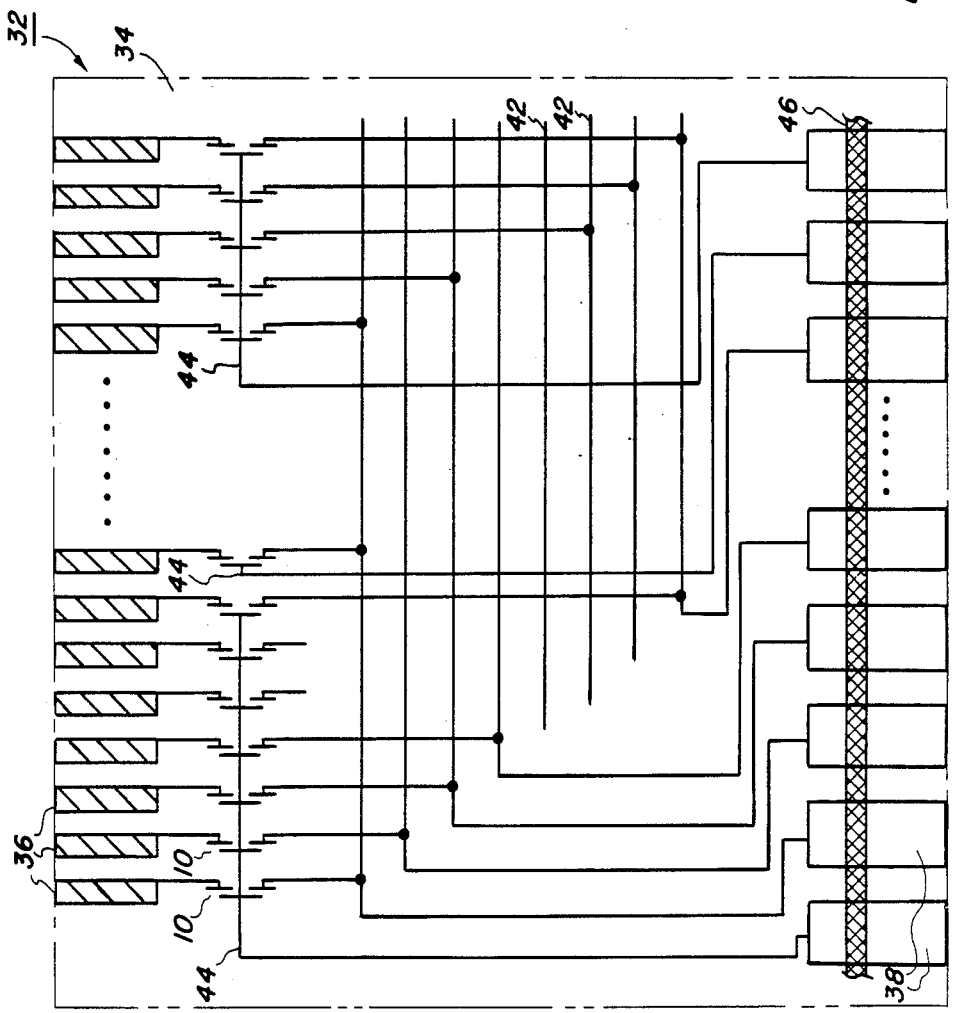

ELECTROSTATIC DISCHARGE PROTECTION NETWORK FOR LARGE AREA TRANSDUCER ARRAYS

FIELD OF THE INVENTION

This invention relates generally to techniques and devices for projecting large area transducer arrays, controlled by thin film transistor circuits, from undesired high voltage effects resulting from electrostatic discharges and, in particular, to equalizing the potential over all elements of the array during an electrostatic discharge event.

BACKGROUND OF THE INVENTION

It is well known in the electronics industry that static electricity can cause severe damage to IC devices. The generation of the electrostatic charge results from the transfer of electrons within a body (polarization) or the transfer of electrons from one body to another (conductive charging), and is usually due to the interaction of bodies. The magnitude of the charge is primarily dependent upon the size, shape, composition and electrical properties of the substances which make up the bodies. The prime sources of electrostatic charge encountered in a manufacturing facility are essentially the interaction of personnel with insulators. Typically, walking across a carpet, or over a vinyl floor, or the handling, rubbing or separating various materials generates electrostatic charges which are transmitted to the person and causes that person to be charged. When the charged person handles or comes close to a susceptible electronic part, that part can be damaged by direct discharge from the contact or by being subjected to the electrostatic field surrounding the charged person. The generation of 15,000 volts between unprotected workers and electronic parts is not unusual in a typical manufacturing facility.

In general, voltage sensitive parts fail due to dielectric breakdown of insulating layers. In a transistor (MOSFET or TFT) dielectric breakdown usually occurs across the gate insulator. As feature sizes are reduced, in order to increase the number of devices upon a single substrate, this scaling makes the transistor more vulnerable to damage by smaller electrostatic discharges. These discharges may cause catastrophic failure or may shift the transistor operating characteristics out of specification. Failure results when the dielectric strength is exceeded, causing insulator punchthrough and leaving a low resistance short. The high potential difference across the gate dielectric, caused by the presence of static charge, results in charges being trapped in the dielectric and shielding the correct operational electric field from the gate.

Numerous electrostatic discharge protection circuits have been developed to protect the transistor gate dielectric against these high voltage effects. These circuits usually are connected directly to the input contact pads and serve to shunt away or reduce high voltage pulses to a value below the critically disruptive value, while not interfering with device electrical performance. Usually these protection networks include diodes and other elements for which IC chip real estate must be allocated.

It is one object of the present invention to provide a simple, low cost, electrostatic discharge protection network for large area thin film transducer arrays wherein each transducer has associated therewith an addressing circuit including at least one thin film transistor.

It is a further object of the present invention to provide paths for potential equalization of all elements on the array in response to spurious electrostatic discharges.

SUMMARY OF THE INVENTION

These objects may be achieved, in one form, by providing, upon an insulating substrate, a large area thin film transducer array iin which each transducer has associated therewith an addressing circuit for changing the state of the transducer element, and wherein each addressing circuit includes at least one thin firm transducer having a resistive path provided between the thin film transistor gate electrode and one or both of the transistor's other two terminal electrodes in order to provide current leakage paths for equalizing the potential between the gate electrode and the other two terminals during an electrostatic discharge. The ohmic value of the resistive path is selected to be large enough so that current leakage between the gate electrode and the other two terminals does not affect the normal operation of the thin film transistor.

BRIEF DESCRIPTION OF DRAWINGS

The advantages of the present invention will be understood by those skilled in the art through the following detailed description when taken in conjunction with the accompanying drawings, in which:

FIG. 4 illustrates another embodiment of this invention on a large area one dimensional transducer array, FIG. 5a illustrates this invention being practiced on a large area two dimensional transducer array, and FIG. 5b illustrates the cross section of a liquid crystal display controlled by the transducer array of FIG. 5a.

DETAILED DESCRIPTION OF THE ILLUSTRATED EMBODIMENTS

Figure 1:
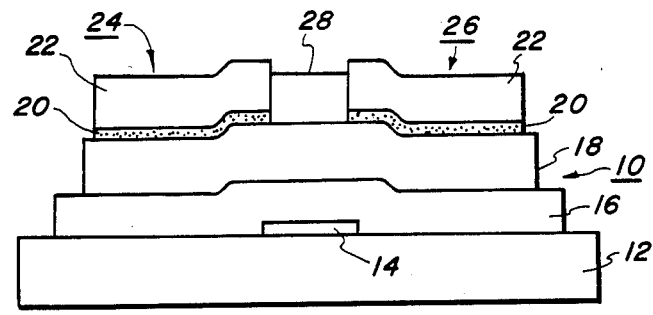
FIG. 1 shows a side elevation view of a thin film transistor.

Turning now to the drawings there is illustrated the structure of a well known amorphous silicon (a-Si:H) thin film transistor (TFT) 10, the so-called inverted structure. It comprises a substrate 12 made of glass, ceramic, or any other insulating material that remains adequately smooth and flat in the common amorphous silicon TFT processing temperature range ($<350°$ C.); a gate electrode 14, typically 500 to 1000 angstroms thick formed by a thin layer of Cr, NiCr or other suitable material, located on the substrate; a gate dielectric 16, typically a silicon nitride layer several thousand angstroms thick, overlying the gate electrode; an a-Si:H charge transport layer 18 a few hundred to a few thousand angstroms thick; terminal electrodes formed of a thin n+ a-Si:H layer 20 and an Al contact layer 22 about 1 micron thick formed as the source 24 and the drain 26; and a second silicon nitride layer 28 deposited over the a-Si:H layer in the channel region for passivation purposes.

As between source 24 and drain 26, a current leakage path through the aSi:H semiconductor layer 18 exists when the gate of the transistor is not connected to any voltage source, i.e., when the gate electrode is floating. Therefore, during an electrostatic discharge to either the source electrode or the drain electrode, the leakage path would allow the charge to move to the other electrode, thus equalizing their potentials. Since virtually no current can flow across the gate dielectric, electrostatic discharge to the gate electrode could cause a large amount of charge to accumulate on the gate electrode, thus generating an extremely large potential difference across the gate dielectric between the gate electrode and either or both of the source electrode and drain electrode. This is particularly true when the gate electrode is floating and the accumulated electrostatic charges cannot be drained away. Then the extremely large potential difference appearing across the gate dielectric can cause the damage described.

To substantially minimize electrostatic discharge damage to the transistor 10, it is proposed to establish a high resistance current path connecting the gate 14 to the source 24 and/or the drain 26 by means of a resistor 30. The alternative configurations are illustrated in FIGS. 2a, 2b and 2c. These allow the potential to be equalized across the gate dielectric 16. In any of the three cases care must be taken in selecting the proper value for the resistor. By selecting a resistor whose value is too low the resistor pair (FIG. 2a) could thwart the proper operation of the TFT by bypassing the semiconductor layer. Alternatively, if the ohmic value is too high, the resistor will not dissipate the electrostatic discharge fast enough to prevent damage to the gate dielectric. As a general rule, the value of the resistor should be such that the leakage current therethrough does not affect the proper operation of the transducer element. The proper choice of the resistance value depends upon the particular circuitry in each application.

Figure 3:
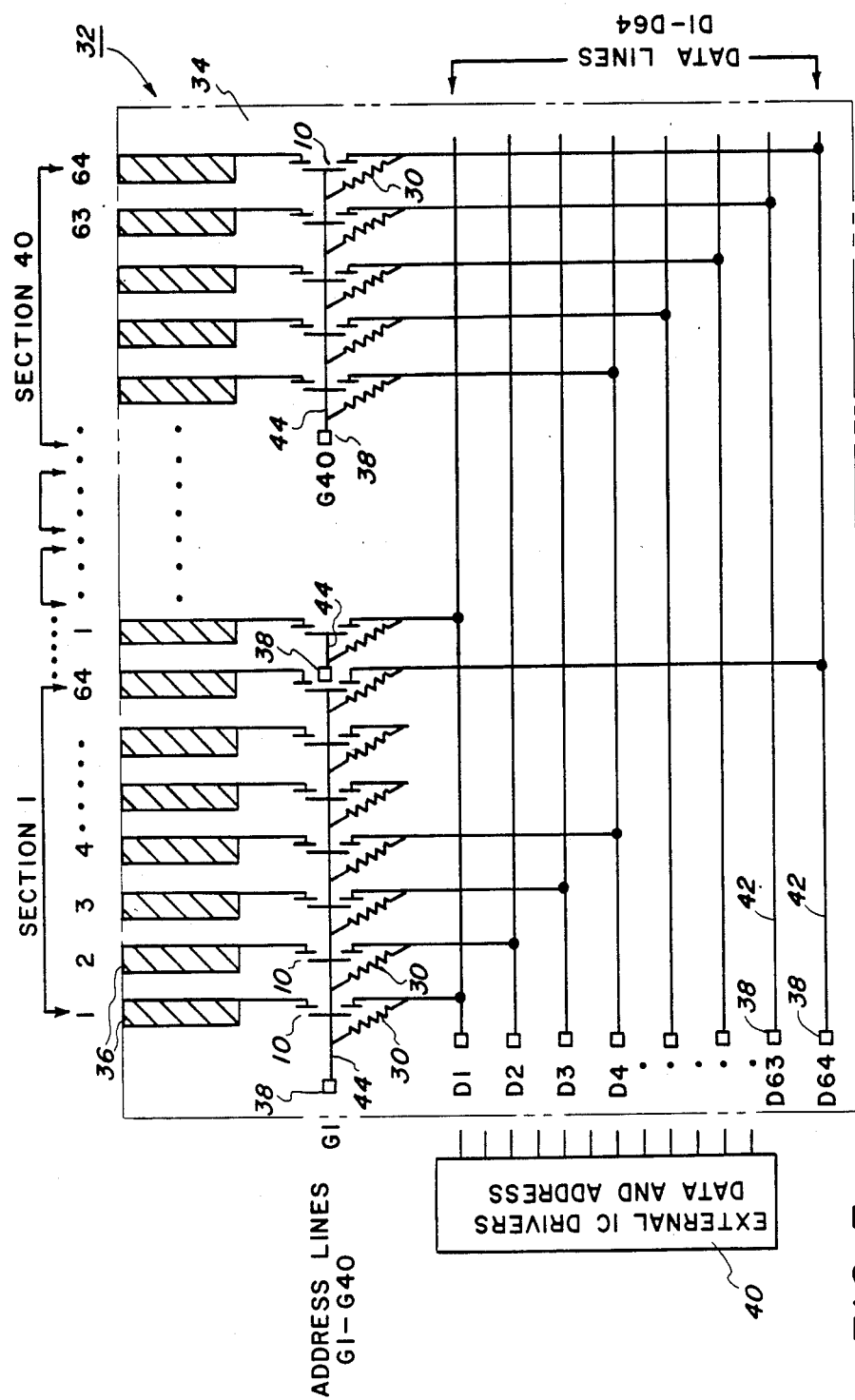
FIG. 3 illustrates one embodiment of this invention on a large area one dimensional transducer array.

Turning to FIG. 3 there is illustrated a one dimensional transducer array 32 in the form of a marking head of the type fully disclosed and described in U.S. Pat. No. 4,584,592. It includes a large area glass substrate 34 which has been typically made eleven inches by three-quarters inch having thereon, along one edge, marking electrodes 36, and along the opposite edge, input contact pads 38 (more accurately illustrated in FIG. 4, and only schematically represented as bus lines in FIG. 3). In use, the contact pads are connected to receive marking information from external IC drivers 40. By means of a multiplexed addressing arrangement, 104 input contact pads comprising 64 data lines 42 and 40 gate address lines 44 are sufficient for controlling 2560 marking electrodes. Each of the gate address lines controls a section of 64 TFTs 10, of the type described above. All of the elements, i.e. marking electrodes, TFTs, address lines, data lines and input contact pads, are integrally formed on the insulating substrate by thin film fabricating techniques.

When the array is not connected in a printing machine and is floating electrically, as when it is being handled during testing, sorting, inspecting, packaging and being installed in a printing machine, it is likely to make contact with a body which carries an electrostatic charge. The electrostatic charge which unsuspectedly has accumulated on an operator may be released to the array and may destroy or damage one or more of the thin film transistors, in the manner described above.

Figure 2:
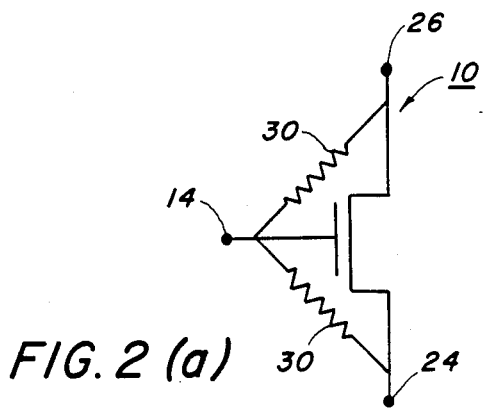
FIG. 2a schematically illustrates a thin film transistor wherein the gate electrode is connected to both the source and drain terminal electrodes by resistors, FIG. 2b schematically illustrates a thin film transistor wherein the gate electrode is connected to the drain terminal electrode by a resistor, FIG. 2c schematically illustrates a thin film transistor wherein the gate electrode is connected to the source terminal electrode by a resistor.
Figure 2:
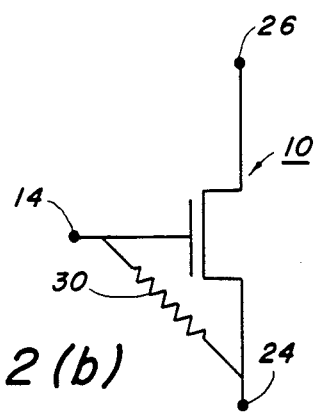
Figure 2:
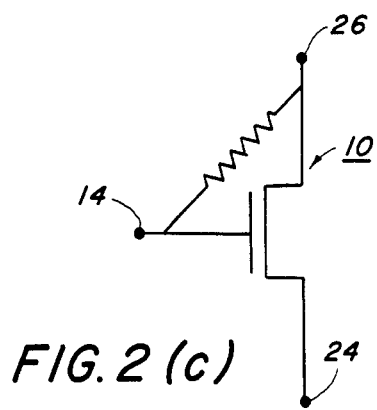

In order to protect each TFT, a resistor 30 is shown connected between each gate electrode 14 and each source electrode 24. Depending upon the function and arrangement of the transducer array it may be more desirable to connect the gate electrode to either the drain electrode or to both the source electrode and the drain electrode, as illustrated in FIG. 2. By convention herein, the terminal of the TFT which is connected directly to the transducer element is identified as the drain electrode. In the transducer array of FIG. 3 wherein the transducers are marking electrodes 36 of the printer device described in U.S. Pat. No. 4,584,592 and each marking electrode must hold the charge deposited thereon for an entire line time, care must be taken to avoid establishing any current leakage path between the drain electrode and the gate electrode. Therefore, it would be undesirable to connect the drain electrode to the gate electrode with resistor 30.

Although the FIG. 3 embodiment will operate satisfactorily to protect the TFTs from electrostatic discharge damage, it is not the optimum solution. This is because the resistors 30 take up valuable real estate which will be at a premium when fabricating higher resolution marking head arrays. Also, as the marking head arrays comprise more complex drive circuits, such as those envisioned for multifunction operation, these drive circuits will include several transistors associated with each marking electrode, and it would become burdensome to provide a resistor for each transistor.

Therefore, rather than practicing this invention as shown in the FIG. 3 embodiment, a much simpler approach is shown in the embodiment of FIG. 4. The same result may be achieved by connecting all of the input contact pads 38 extending along one edge of the marking head array 32 with a resistive stripe 46 coextensive with the line of pads and in electrical contact with them so as to form inter-contact pad resistors. This results in connecting all the data lines 42 and all the gate address lines 44 so that electrostatic charge accumulating on any one, or more, of these lines will leak rapidly throughout the array and will equalize the potential on all elements thereon.

The two major advantages of this configuration are: first, the resistive stripe 46 may be fabricated simultaneously with the deposition of the n+ a-Si:H source and drain layers; and, second, that the resistive stripe is located on the substrate at a location where it will not compete for real estate. It should be understood that the resistive stripe may be fabricated of lightly doped or undoped a-Si:H if desired, in order to be consistent with, and to be deposited simultaneously with, other device layers. N+ a-Si:H is particularly appealing because its resistivity is approximately $10^2$ ohm-cm and in thin film form it is not uncommon to make resistors in the range of $10^7$ to $10^9$ ohms.

Practical protective networks may be made with a resistive stripe whose inter-contact pad resistance is in the range of 5 to 100 mega-ohms. The resistive value of the inter-contact pad resistors must be selected to be low enough to leak charge at a speed to prevent the undesirable electrostatic discharge effects and high enough so that during operation the voltage level on one contact pad will not be significantly affected by voltage levels on its neighboring contact pads. Since the external IC chips used to drive the marking array have a relatively low output impedance (on the order of several kilo-ohms), there will be no significant crosstalk between adjacent contact pads at different voltages when adjacent contact pads are connected together by these large inter-contact pad resistors (on the order of several mega-ohms). Typically, the resistance value should be greater than about ten times the output impedance of the external drive circuit.

In copending patent applications Ser. No. 861,472 filed on May 9, 1986 entitled "Improved Writing Head" (H. C. Tuan and M. J. Thompson) there is disclosed transducer arrays in which each marking electrode transducer element is controlled by an addressing circuit comprising two thin film transistors. The present invention, applied to that array, would protect both TFTs from electrical discharges.

Figures 5A, 5B:
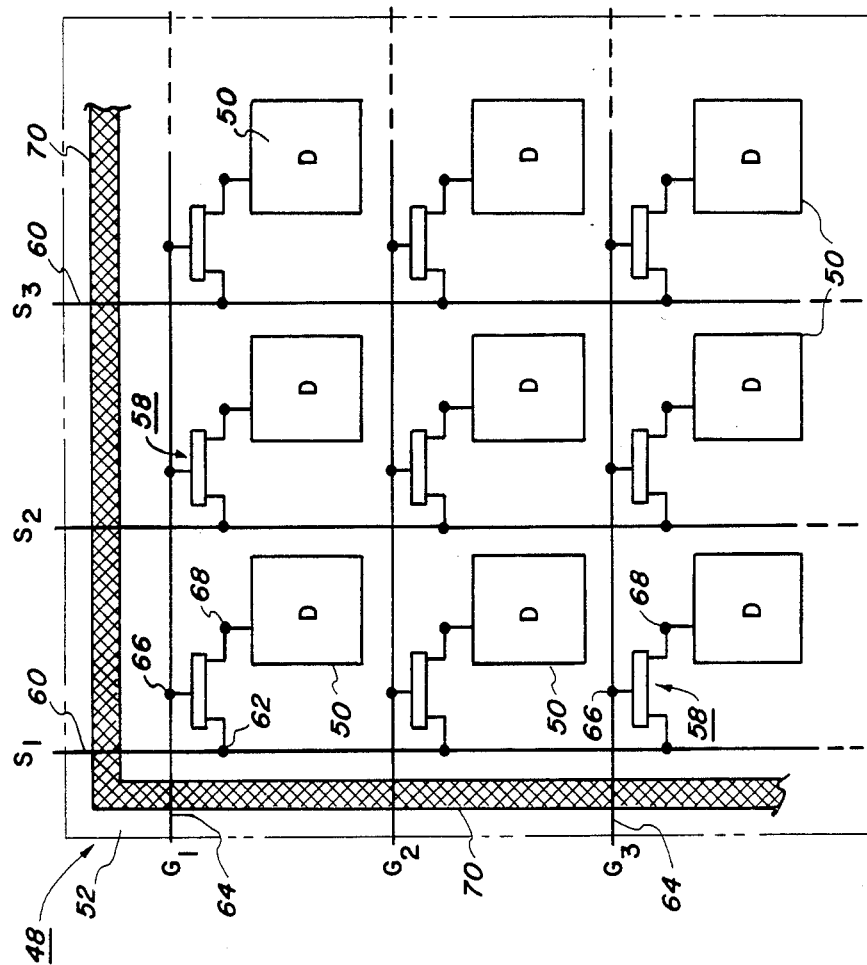

The same approach to a protective network may also be used in the two dimensional transducer array 48, shown in FIGS. 5a and 5b. In this embodiment, an orthongonal arrangement of display electrodes 50 is deposited upon a large insulating substrate 52 so as to control the orientation of liquid crystal material 54 in each pixel of a display panel 56. The state of each display electrode is controlled by a TFT 58. Each transistor receives a data signal along a data line 60, connected to its source electrode 62, and an address signal along gate line 64 connected to its gate electrode 66. When the gate voltage turns the transistor ON current flows from the source electrode 62 to the drain electrode 68 and then to the display electrode 50. All the source lines ($S_1$ to $S_N$) and all the gates lines ($G_1$ to $G_N$) are shown connected together with suitable resistors, for example, n+ a-Si:H resistive stripes 70. By following the principles of resistive value selection set forth above, a protective network will be effected which will protect the gate dielectrics of all the switching transistors from electrostatic discharge but will have no effect on normal operation.

It should be understood that the present disclosure has been made only by way of example and that numerous changes in details of construction and the combination and arrangement of parts may be resorted to without departing from the true spirit and the scope of the invention as herienafter claimed.

What is claimed:

1. An electrostatic discharge protection network for a large area transducer array, said array including a substrate on which is formed a plurality of thin film transducer elements and a thin film addressing circuit associated with each transducer element for changing the state of said transducer element, each of said addressing circuits including at least one thin film amorphous silicon transistor having a source terminal electrode and a drain terminal electrode spaced from one another and contiguous to a semiconductor layer, a gate electrode spaced from said semiconductor layer by a gate dielectric layer and located so as to control the current flow from said source terminal electrode to said drain terminal electrode, through said semiconductor layer, and a plurality of input contact pads for receiving external signals, connected to said addressing circuit, for controlling the state of said transducer elements said protection network including a strip of n+ amorphous silicon resistive material extending across all of said input contact pads, and resistor means comprising inter contact pad portions of said stripe of resistive material for providing current leakage paths to equalize the potential across all of said gate dielectrics during an electrostatic discharge and wherein said resistor means as connected to said circuits and functioning to provide current leakage paths does not affect the normal operation of said thin film transistors.

2. The electrostatic discharge protection network for a large area transducer array as defined in claim 1 wherein said transducer elements extend in two directions and comprise display electrodes formed orthogonally over the surface of said substrate.

3. The electrostatic discharge protection network for a large area transducer array as defined in claim 1 wherein the value of said resistor means is at least an order of magnitude greater than output impedance of an external driver circuit connected to said input contact pads.

* * * * *